United States Patent [19]

Woodhouse

[11] Patent Number: 5,537,204
[45] Date of Patent: Jul. 16, 1996

[54] AUTOMATIC OPTICAL PICK AND PLACE CALIBRATION AND CAPABILITY ANALYSIS SYSTEM FOR ASSEMBLY OF COMPONENTS ONTO PRINTED CIRCUIT BOARDS

[75] Inventor: Glenn P. Woodhouse, Boise, Id.

[73] Assignee: Micron Electronics, Inc., Boise, Id.

[21] Appl. No.: 408,081

[22] Filed: Mar. 20, 1995

Related U.S. Application Data

[63] Continuation-in-part of Ser. No. 335,284, Nov. 7, 1994, abandoned.

[51] Int. Cl.$^6$ ..................................................... G06K 9/00
[52] U.S. Cl. ........................................... 356/243; 356/401
[58] Field of Search ..................................... 356/243, 401

[56] References Cited

U.S. PATENT DOCUMENTS

| | | | |
|---|---|---|---|
| 4,776,088 | 10/1988 | Biggs et al. | 29/834 |
| 5,237,622 | 8/1993 | Howell | 382/8 |
| 5,247,844 | 9/1993 | Howell | 73/865.8 |

OTHER PUBLICATIONS

"Test Target–For Robotic Vision Placement of Surface Mount Devices", Start, Applied Image, Inc., 1993, p. 60.
Woodhouse, "Low–Cost Calibration: Key to Effective Placement", SMT, May 1994, pp. 36–40.

Primary Examiner—Richard A. Rosenberger
Attorney, Agent, or Firm—Kevin D. Martin

[57] ABSTRACT

A method and apparatus for calibrating and performing statistical capability analysis of a pick-and-place machine comprise loading a glass fiducial plate onto a workholder of a pick-and-place machine, loading a glass slide onto a part placement nozzle of the pick-and-place machine, and placing the glass slide onto the plate. Alignment of a chrome fiducial on the fiducial plate with a chrome target window on the slide is examined. Responsive to the alignment of the target and the fiducial, key calibration codes in calibration software of the pick-and-place machine are adjusted. Once calibration is complete, multiple placement cycles using the glass fiducial plate and glass slides are performed to determine the statistical placement capability of the pick-and-plate equipment.

19 Claims, 1 Drawing Sheet

AUTOMATIC OPTICAL PICK AND PLACE CALIBRATION AND CAPABILITY ANALYSIS SYSTEM FOR ASSEMBLY OF COMPONENTS ONTO PRINTED CIRCUIT BOARDS

This is a continuation-in-part of application Ser. No. 08/335,284, filed Nov. 7, 1994, now abandoned.

FIELD OF THE INVENTION

This invention relates to the field of printed circuit board assembly. More specifically, a method and apparatus for calibrating and for performing statistical capability analysis of component pick-and-place equipment is disclosed.

BACKGROUND OF THE INVENTION

Pick-and-place equipment is commonly used to assemble integrated and discrete components onto printed circuit boards (PCBs). Various models and manufacturers of pick-and-place equipment exist, for example a Model IP-II available from Fuji America Corporation of Lincolnshire, Ill., among others. The pick-and-place equipment removes the component from a first position, for example from a tape-and-reel, aligns the component with the PCB, and places it into its proper location on the PCB. Solder on the PCB is heated to electrically connect the component into its proper location on the PCB.

To ensure the proper alignment of the component on the PCB, the pick-and-place equipment must be calibrated. This calibration is typically achieved with actual electronic components and printed circuit boards. The components are assembled onto the PCB by the pick-and-place equipment, then the alignment of the devices is checked using visual inspection with an unaided eye or using a microscope. If the devices are determined by a technician to be misaligned in the X-, Y-, or Theta (rotational) axes, adjustments to the pick-and-place equipment are performed. The process continues until an acceptable alignment of the component to the PCB is established. A similar calibration system is described in U.S. Pat. No. 4,776,088 which is incorporated herein by reference.

Various problems are associated with present methods of calibrating pick-and-place equipment. For example, the components and PCBs themselves are allowed certain manufacturing tolerances, which thereby make their use as a calibration tool questionable. A component that is at the outer range of a design tolerance, if used to calibrate the equipment, may provide for a less than ideal target for the majority of devices which adhere more closely to the design goal. Also, the alignment which is considered acceptable can vary from one technician to another even with training, as there is no quantitative measurement typically employed to pass or fail the alignment of a device to the PCB. As a result of the lack of quantitative measurements there is no means to statistically assess the machine's repeatability and capability.

A method and apparatus which allows for an accurate, quantitative, repeatable calibration of pick-and-place equipment would be desirable.

SUMMARY OF THE INVENTION

An apparatus for calibrating pick-and-place equipment comprises a target, for example of chrome plating, on a transparent slide and a transparent fiducial plate comprising alignment fiducials, for example of chrome plating. The apparatus further comprises means for securing the slide to the fiducial plate. In operation, the slide is positioned on the plate by the pick-and-place equipment such that the target and the fiducial are aligned in a manner which facilitates precise placement measurement by an automatic optical comparator for the purpose of calibration of the pick-and-place equipment for and statistical pick-and-place equipment accuracy and repeatability analysis.

Objects and advantages will become apparent to those skilled in the art from the following detailed description read in conjunction with the appended claims attached hereto.

Figure 1:
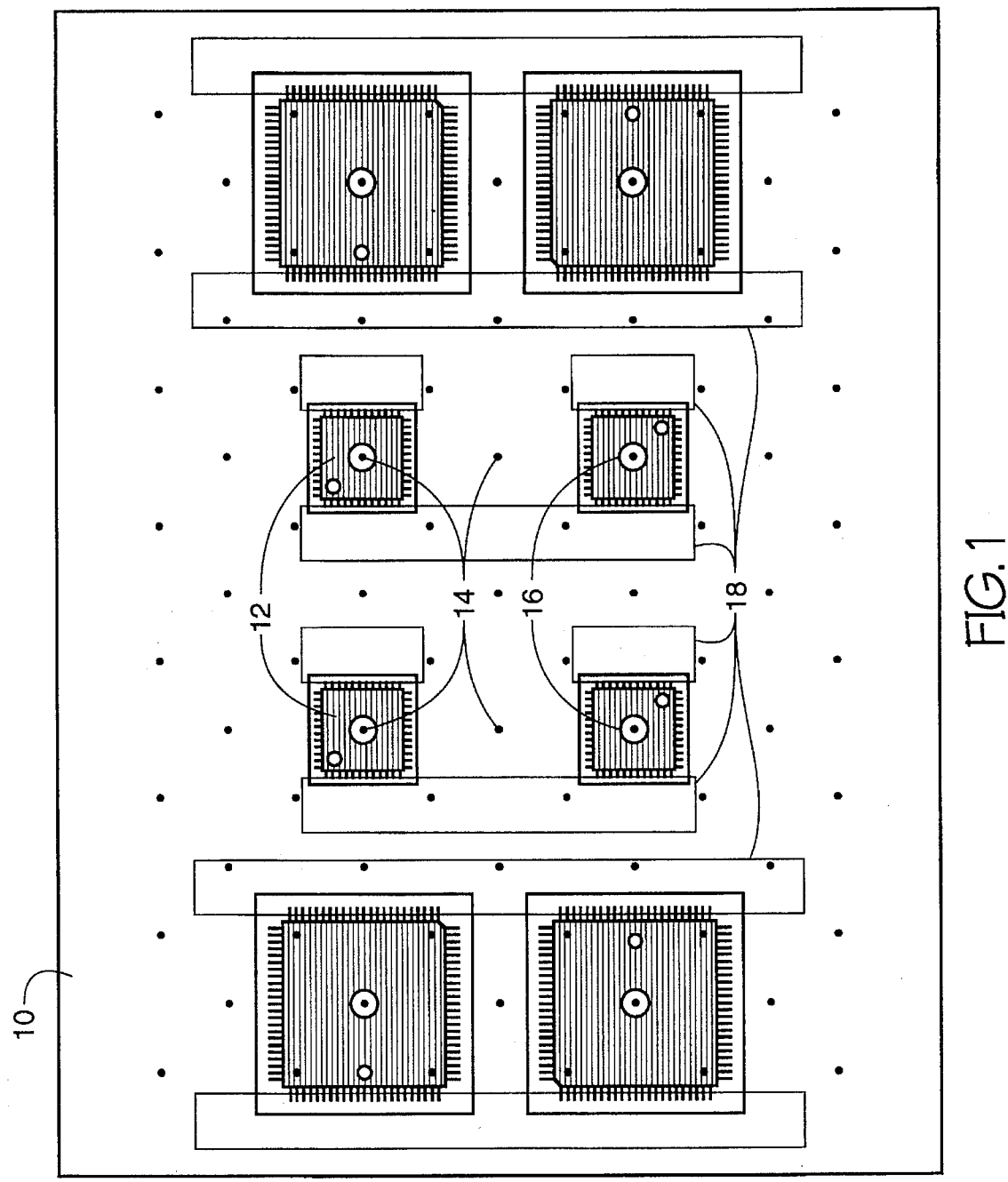
FIG. 1 is a plan view showing transparent slides on a fiducial plate.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE INVENTION

In accordance with one embodiment of the invention as shown in FIG. 1, a pick-and-place calibration apparatus comprised a transparent fiducial plate 10 and a chrome-plated glass slide 12. The slide comprised a transparent plate incorporating an image of an electronic device package outline, or some other target. The fiducial plate replaced the PCB and the transparent slide replaced the component for calibration purposes. The fiducial plate and transparent slide were manufactured from glass, although other materials such as plastic or resin may also function sufficiently. However, the fiducial plate and slides must be sufficiently transparent to allow for accurate measurement of the placement of the slide on the plate. Also, the material used to form the slide must be sufficiently scratch resistant to allow for cleaning of the plate and for normal contact with other equipment during use.

The plate and slides were generally about the same size as the elements they replaced. The transparent slides and fiducial plate comprised chrome-plated glass etched to produce images in the form of dots 14 or fiducials on the glass plate 10 and an outline of electronic component packages as shown in FIG. 1 with measurement targets 16 on the glass slides. The targets on the glass slides comprised a round window 16, and the fiducials on the glass plate comprised a plurality of dots 14. Numerous other target schemes such as one or more cross hairs, bull's-eyes, etc. would function sufficiently.

In use, means for securing the transparent slide to the fiducial plate is used. In one instance, double-sided tape 18 was placed on the glass fiducial plate such that the glass slide, when placed in its proper location, would be held by the tape around its perimeter to the fiducial plate. The tape served to secure the slides in place and to minimize movement of the slide which would decrease the accuracy of the calibration. Other means for securing the slide to the fiducial plate may function adequately, such as a silicone adhesive or other adhesives, pastes or glues.

After the tape was placed on the glass fiducial plate, the plate was loaded into the pick-and-place equipment just as a PCB would be loaded. A software program specific to the inventive procedure was then run on the pick-and-place equipment. The software program can be easily developed by one of skill in the art from the information herein, as the program was typical of a normal product assembly pick-and-place program. The glass slides can be delivered to nozzles on the pick-and-place equipment by hand, with a waffle tray feeder, or by a tape-and-reel feeder, and all produced sufficient results. The placement nozzles then placed the glass slides on the tape which was on the glass fiducial plate. Due to the smooth surface of the glass slides, the slides can be texturized to reduce slippage of the slides on the placement nozzles during rotation and translation. Slippage can reduce the accuracy of the test system. The texturization, which is placed where a nozzle contacts a slide during placement, can be accomplished using a laminated polymer such as electrical tape or it may be possible to texturize the slide itself. Other equivalent texturization is possible and likely. If texturization is used care must be taken to avoid interference of any target features by the texturization. Interference may hinder or reduce the accuracy of the automatic measurement described below.

Once the placement of the glass slides onto the glass plate was completed, the plate-slide assembly was placed on an X-Y table of an automatic optical comparator. An optical comparator with sufficient accuracy such as a Model Q-See 200 available from Optical Gauging Products of Rochester, NY, among others available, would function sufficiently. An inspection program, which is easily developed by one of skill in the art from the information herein, was run on the comparator. The comparator measured the center of an applicable plate fiducial dot and then compared it to the center of a round window on the transparent slide which surrounded the dot. When the equipment was properly calibrated the dot appeared in the center of the window. When the equipment was out of calibration, the dot appeared in the window but was not centered within the window. Optical inspection of slide-to-plate alignment was allowed by the transparent glass plate and transparent window in the chrome plating of the glass slide. Any difference in the location of the center of the fiducial dot and the associated slide window was computed as the X- and Y-axis placement error for each slide placed on the plate. A window similar to the X- and Y-axis windows was included on each of the glass slides for the purpose of rotational reference for Theta (rotational) axis error calculation. The error information was then used to calibrate the pick-and-place equipment by allowing for adjustment of the key calibration codes in the calibration software. Placement/measurement/software adjustment cycles continued until the pick-and-place equipment performed within specified tolerances.

In addition to calibrating the equipment, the calibration method and apparatus was used to measure the pick-and-place equipment placement errors. After the equipment was properly calibrated, multiple placement/measurement cycles were performed to obtain the statistical accuracy and repeatability of the equipment.

The automatic optical comparator uses a separate glass reticle for its own calibration. This reticle has been measured and certified by the National Institute of Standards and Technology (NIST). This NIST traceability for measurement equipment is a requirement for a manufacturer to achieve International Standards Organization (ISO) 9000 certification per NSI/SAQC Q91-1987 "Quality Systems—Model for Quality Assurance in Design/Development, Production, Installation, and Servicing." Additionally, this same document requires a means for formally collecting and documenting calibration data. The nature of this process has been developed so that all optical comparator and pick-and-place equipment calibration data are databased by the optical comparator software. The optical comparator software also generates hard copy reports which are stored in controlled calibration files in accordance with ISO 9000 requirements.

The target on the slide and the fiducial on the glass plate can comprise various patterns other than the round window and dot as described above. For example, the article "Low-Cost Calibration: Key to Effective Placement," *SMT*, May 1994, which is incorporated herein by reference, describes various configurations. A component outline comprising leads and package outline can be placed on the slide, and the leads can be aligned with similar leads on the fiducial. Other schemes are possible and likely.

An inventive method for calibrating a pick-and-place machine can comprise various steps. In one embodiment of the inventive method, the transparent fiducial plate is loaded onto the workholder of the pick-and-place machine, and the transparent slide is loaded onto a part placement nozzle of the pick-and-place machine. Next, the slide is placed onto the fiducial plate by the pick-and-place equipment and secured thereto, for example with double-sided tape. The alignment of a fiducial on the fiducial plate and a target on the slide is examined, for example by an optical comparator. Responsive to the alignment of the target and the fiducial, key calibration codes in calibration software of the pick-and-place machine are adjusted. If the calibration is not within tolerances, the steps are repeated until the calibration is adequate.

Data produced can be used to determine statistical repeatability and accuracy of the individual pick-and-place equipment. This information can be databased for data analysis and historical record.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. An apparatus for calibrating rotational alignment of pick-and-place equipment, comprising:

a) a generally transparent slide comprising a center target and an off-center target thereon;

b) a generally transparent fiducial plate, said plate comprising a plurality of alignment fiducials thereon;

c) means for securing said slide to said fiducial plate, said slide, in operation, being positioned on said plate by the pick-and-place equipment such that said target and said fiducial are aligned by the pick-and-place equipment during calibration of the pick-and-place equipment, said center target aligning with one of said fiducials to calibrate alignment in X and Y axes, and said off-center target facilitating rotational alignment.

2. The apparatus of claim 1 wherein said slide and said fiducial plate comprise glass.

3. The apparatus of claim 1 wherein said slide and said fiducial plate comprise plastic.

4. The apparatus of claim 1 wherein said targets on said slide and said fiducials on said fiducial plate comprise chrome plating.

5. The apparatus of claim 1 wherein said means for securing said slide to said fiducial plate comprises double-sided tape.

6. The apparatus of claim 1 wherein said means for securing comprises glue or paste.

7. The apparatus of claim 1 wherein said means for securing comprises silicone.

8. A method for calibrating a pick-and-place machine, comprising the following steps:
   a) loading a fiducial plate onto a workholder of a pick-and-place machine;
   b) loading a slide onto a part placement nozzle of said pick-and-place machine, said slide having a center target and an off-center target, each said target comprising a generally transparent window;
   c) placing said slide onto said fiducial plate with said pick-and-place machine being calibrated;
   d) examining alignment of a first fiducial on said fiducial plate with said off-center target on said slide, and alignment of a second fiducial on said fiducial plate with said center target on said slide;
   e) responsive to misalignment of at least one of said targets with one of said fiducials, adjusting key calibration codes in calibration software of said pick-and-place machine.

9. The process of claim 8 wherein said steps of loading said fiducial plate through said step of adjusting are repeated.

10. The process of claim 8 wherein said steps of loading said fiducial plate through said step of adjusting are repeated to obtain statistical repeatability and accuracy data.

11. The process of claim 10 wherein said data is databased for data analysis and historical record.

12. The process of claim 8 further comprising the step of securing said slide to said fiducial plate between said step of placing said slide and said step of examining said alignment.

13. The process of claim 12 wherein said slide is secured to said fiducial plate with double-sided tape.

14. The process of claim 8 wherein said examining is performed with an automatic optical comparator.

15. A method for calibrating a pick-and-place machine comprising the following steps:
   a) loading a glass plate having a plurality of fiducial dots onto a workholder of a pick-and-place machine;
   b) loading a glass slide onto a part placement nozzle of said pick-and-place machine, said slide comprising a center target and an off-center target;
   c) placing said glass slide onto said plate with said pick-and-place machine being calibrated;
   d) automatically examining alignment of first and second fiducial dots on said fiducial plate with said center and said off-center targets respectively through said glass slide using an automatic optical comparator, said center target and said first fiducial facilitating alignment calibration in X- and Y-axes and said off-center target and said second fiducial facilitating alignment calibration in rotational axis;
   e) responsive to misalignment of at least on of said targets and one of said fiducials, adjusting key calibration codes in calibration software of said pick-and-place machine.

16. The process of claim 15 wherein said steps of loading said glass plate through said step of adjusting are repeated.

17. The process of claim 15 wherein said steps of loading said glass plate through said step of adjusting are repeated to obtain statistical repeatability and accuracy data.

18. The process of claim 15 further comprising the step of securing said slide to said glass plate between said step of placing said slide and said step of examining said alignment.

19. The process of claim 18 wherein said glass slide is secured to said glass plate with double-sided tape.

* * * * *

UNITED STATES PATENT AND TRADEMARK OFFICE
CERTIFICATE OF CORRECTION

PATENT NO. : 5,537,204
DATED : July 16, 1996
INVENTOR(S) : Glenn P. Woodhouse

It is certified that error appears in the above-indentified patent and that said Letters Patent is hereby corrected as shown below:

In the abstract, last line, please replace "plate" with — place —.

Column 2, line 8, please replace "for and" with — and for —.

Signed and Sealed this

Seventeenth Day of December, 1996

Attest:

BRUCE LEHMAN

Attesting Officer

Commissioner of Patents and Trademarks